United States Patent
Souto-Diez et al.

(10) Patent No.: US 6,819,913 B2
(45) Date of Patent: Nov. 16, 2004

(54) LOW-NOISE FREQUENCY CONVERTER WITH STRONG REJECTION OF IMAGE FREQUENCY

(75) Inventors: Anabel Souto-Diez, Chateauneuf de Grasse (FR); Jerome Pierre Paul Langanay, Villons-les-Buissons (FR); Benoît Feron, Caen (FR)

(73) Assignee: Koninklijke Philips Electronics N.V., Eindhoven (NL)

(*) Notice: Subject to any disclaimer, the term of this patent is extended or adjusted under 35 U.S.C. 154(b) by 627 days.

(21) Appl. No.: 09/835,634

(22) Filed: Apr. 16, 2001

(65) Prior Publication Data

US 2002/0008983 A1 Jan. 24, 2002

(30) Foreign Application Priority Data

Apr. 18, 2000 (FR) .............................................. 0004996

(51) Int. Cl.[7] .............................................. H04B 15/00
(52) U.S. Cl. ...................... 455/313; 455/311; 455/326; 455/333; 455/285
(58) Field of Search ................................. 455/313, 323, 455/326, 333, 302, 130, 285, 317, 311; 375/261, 298

(56) References Cited

U.S. PATENT DOCUMENTS

| | | | | |
|---|---|---|---|---|
| 5,574,755 A | * | 11/1996 | Persico | ........................ 375/295 |
| 5,847,623 A | * | 12/1998 | Hadjichristos | ............... 332/105 |
| 6,057,714 A | * | 5/2000 | Andrys et al. | ............... 327/105 |
| 6,324,388 B1 | * | 11/2001 | Souetinov | .................... 455/302 |
| 6,489,816 B1 | * | 12/2002 | Ma | ............................ 327/113 |

FOREIGN PATENT DOCUMENTS

| EP | 0903846 A2 | 3/1999 |
|---|---|---|
| WO | 9520284 A1 | 7/1995 |

* cited by examiner

*Primary Examiner*—Sonny Trinh
(74) *Attorney, Agent, or Firm*—Aaron Waxler

(57) ABSTRACT

The invention relates to a frequency converter designed for supplying an output signal having a radio frequency FR equal to the difference between the frequency FLO of a signal OS originating from an oscillator VCO and the frequency FI of an input signal IS. The frequency converter has two quadratic modules QM1 and QM2 for separating the signal originating from the oscillator OS and the input signal IS into two components (LO1, LO2) and (FI1, FI2) in phase quadrature, two mixers MX1, and MX2 for multiplying the components thus obtained two-by-two, and combination means COMB for recombining the output signals RS1 and RS2 of the mixers MX1 and MX2. The frequency converter operates internally a good rejection of the image frequency while providing a good performance as regards noise and gain and an improved linearity as compared with known converters. Thus, frequency shifting before transmission in a wireless telephone may be accomplished.

6 Claims, 3 Drawing Sheets

LOW-NOISE FREQUENCY CONVERTER WITH STRONG REJECTION OF IMAGE FREQUENCY

FIELD OF THE INVENTION

The invention relates to a frequency converter designed for receiving an input signal having an intermediate frequency and a signal originating from an oscillator and having an oscillation frequency, and for supplying an output signal having a radio frequency whose value is equal to the absolute value of the difference between the oscillation frequency and the intermediate frequency.

Such a frequency converter is known from the specification of the RF2640 circuit manufactured by the RF Micro-Devices Company.

BACKGROUND

This circuit is designed for generating an output signal of asymmetrical character on the basis of an input signal of a differential character, the signal originating from the oscillator also being of an asymmetrical character. The output signal is the result of a multiplication operation between the input signal and the signal coming from the oscillator. If the output signal of such a frequency converter comprises a component whose frequency is equal to the difference between the oscillation frequency and the intermediate frequency, it will also comprise a parasitic component whose frequency is equal to the sum of the oscillation frequency and the intermediate frequency, this sum being referred to here as the image frequency. The output signal of the frequency converter carries a frequency information which is then split between the radio frequency and the image frequency, whereas a receiver of this information will be configured for receiving the radio frequency only. The parasitic component should accordingly be suppressed so that only the component of the output signal of the frequency converter having the radio frequency will contain the useful information to be transmitted, because otherwise the transmitted signal will be useless for the receiver for which this information is destined. This requires the use of a filtering device in addition to the frequency converter. Besides, the gain and the linearity of the known frequency converter are insufficient for a number of applications and have to be improved by means of components external to the converter, such as microstrip lines, which further complicate the use of the known converter.

SUMMARY OF THE INVENTION

The invention has for its object to counteract the above disadvantages by providing a frequency converter which is capable of realizing internally a satisfactory rejection of the image frequency while offering a good performance as regards noise and gain and a linearity which is improved with respect to the known converter.

According to the invention, a frequency converter as described in the opening paragraph for this purpose comprises:

a first quadratic module designed for receiving the output signal from the oscillator and for supplying a first and a second output signal in mutual phase quadrature, both having the oscillation frequency as their frequency, a second quadratic module designed for receiving the input signal of the converter and for supplying a first and a second output signal in mutual phase quadrature, both having the intermediate frequency as their frequency, a first mixer designed for supplying an output signal which represents a product of the first output signals of the first and second quadratic modules, a second mixer designed for supplying an output signal representing a product between the second output signals of the first and second quadratic modules, and combination means for recombining the output signals of the first and second mixers.

The advantages of the invention may be readily understood from the ensuing example, in which the input signal of a frequency converter according to the invention is given by the expression $IS=\sin(\omega_{FI} \cdot t)$, while the output signal of the oscillator is given by the expression $OS=\sin(\omega_{LO} \cdot t)$. In this example, the first and the second quadratic module are arranged so as to generate respective first and second signals (FI1; FI2) and (LO1; LO2), which are written as follows:

$$FI1=\sin(\omega_{FI} \cdot t+\Pi)$$

$$FI2=\sin(\omega_{FI} \cdot t+3\Pi/2)$$

$$LO1=\sin(\omega_{LO} \cdot t+\Pi/4)$$

$$LO2=\sin(\omega_{LO} \cdot t+3\Pi/4)$$

The output signals RS1 and RS2 of the first and second mixers resulting from the multiplication operations carried out by said mixers are then written as follows, using conventional trigonometric formulas:

$$RS1=(\sin((\omega_{LO}-\omega_{FI}) \cdot t+\Pi/4))/2-(\sin((\omega_{LO}+\omega_{FI}) \cdot t+\Pi/4))/2, \text{ and}$$

$$RS2=(\sin((\omega_{LO}+\omega_{FI}) \cdot t+\Pi/4))/2.$$

After recombination of said output signals, the frequency converter delivers a signal which represents the sum of the output signals of the first and second mixers, which is thus written as $RS=\sin((\omega_{LO}-\omega_{FI}) \cdot t+\Pi/4)=\sin(\omega_{RF} \cdot t +\Pi/4)$, and which accordingly only comprises a component having the radio frequency equal to $\omega_{RF}/2\Pi$. The frequency converter according to the invention thus automatically realizes a good rejection of the image frequency, because no $\sin((\omega_{LO}+\omega_{FI}) \cdot t)$ component is present in the output signal of the frequency converter.

In an embodiment of the invention, each mixer comprises two differential pairs forming a Gilbert cell whose conduction is intended to be controlled by one of the output signals of the first quadratic module, and which pairs are designed to be baised by means of one of the output signals of the second quadratic module.

This embodiment is simple and uses tried and tested elements. Moreover, the biasing of the Gilbert cells by means of the output signals of the second quadratic module enables to reduce to a minimum the interface between the input signal of the frequency converter and the mixers, and thus to limit the noise generated by the multiplication of the input signal by the signal originating from the oscillator.

In a particular embodiment of the invention, the second quadratic module is provided with a transconductance stage enabling it to transform a voltage information carried by the input signal of the converter into a current information.

This embodiment allows a maximum simplification of the interface between the second quadratic module and the mixers if the input signal is formed by a voltage, which is usually the case in the present state of the art. The use of a transconductance stage furthermore permits to obtain a good linearity for the multiplications carried out by the mixers.

In a modification of this embodiment, the second quadratic module includes a polyphase filter enabling the production of a plurality of currents out of phase with one another and representative of the information carried by the input signal.

In a particularly advantageous embodiment of the invention, the second quadratic module and the first and the second mixer are incorporated within a same integrated circuit.

The integration indicated above allows a reduction in the connection line lengths between the various integrated elements, and thus a reduction of the noise generated by the frequency converter to a minimum.

The frequency converter according to the invention may be used in any type of application where a frequency conversion is required, particularly frequency shifts before transmission of radio wave signals. In one of these embodiments, the invention also relates to a wireless telephony device comprising a signal processing unit signal and an antenna designed for transmitting a radio frequency signal, characterized in that it comprises in addition a frequency converter as described above and designed for receiving its input signal from the signal processing unit, while the output signal of said frequency converter forms the radio frequency signal.

BRIEF DESCRIPTION OF THE DRAWINGS

The invention will be better understood from the following description, which is given by way of example and to which the invention is by no means limited, with reference to the annexed drawings in which.

DETAILED DESCRIPTION

Figure 1:
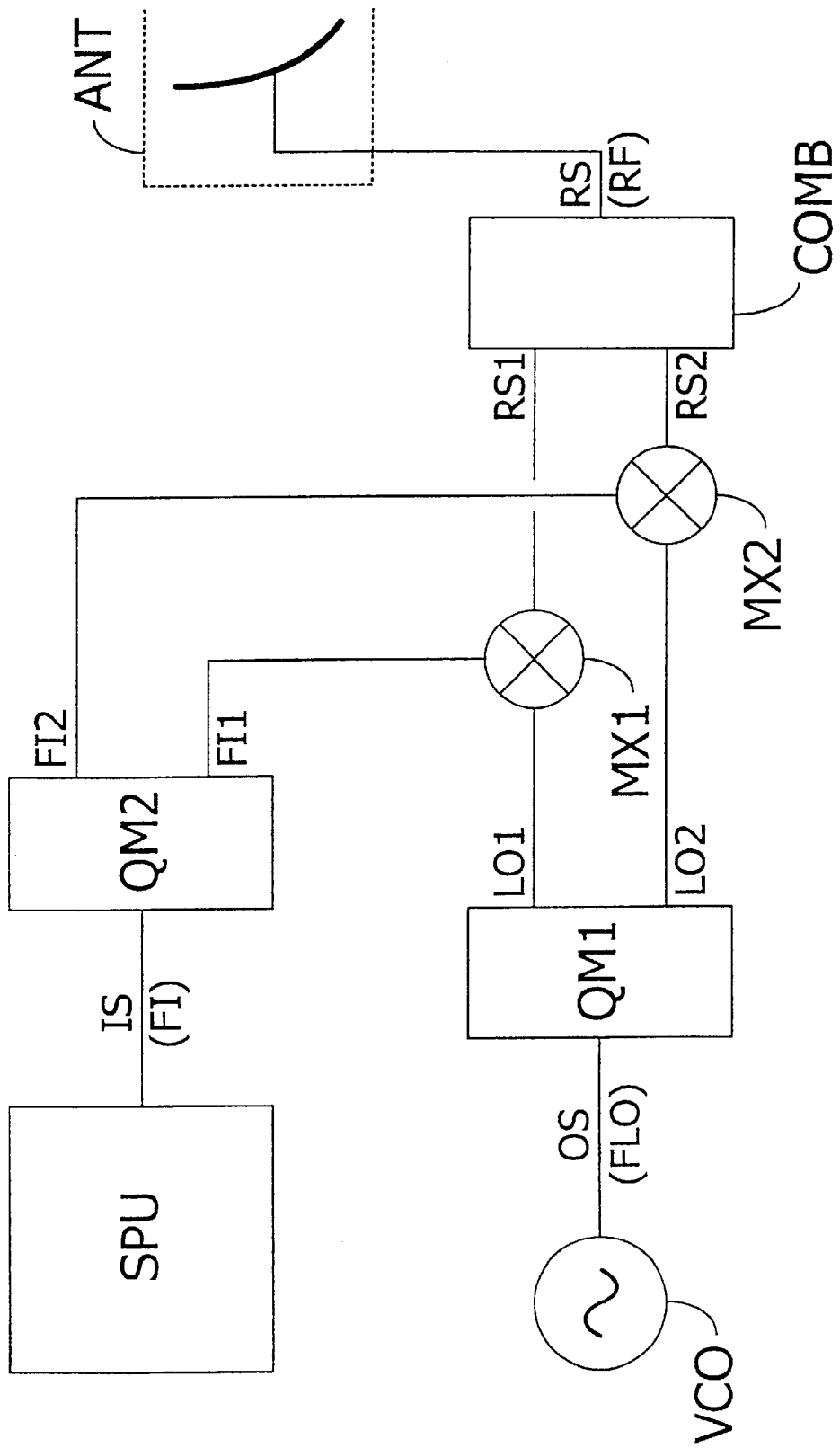
FIG. 1 is a partial block diagram depicting the functions of a wireless telephony device which utilizes a frequency converter according to the invention.

FIG. 1 diagrammatically shows a wireless telephone comprising a signal processing unit SPU and an antenna ANT designed for transmitting a radio frequency signal RS representative of an input signal IS issued by the signal processing unit SPU, having a frequency FI called intermediate frequency whose average value is generally chosen to be 180 MHz. The instantaneous value of the frequency of the input signal IS constitutes the information carried by said signal. This information is to be retrieved from the radio frequency signal RS. A frequency converter (QM1, QM2, MX1, MX2, COMB) is used for attributing a radio frequency RF of high average value, for example 835 MHz in accordance with the GSM standard, to the signal RS to be transmitted. To achieve this, a local oscillator VCO is used which supplies a signal OS which has a high oscillation frequency FLO, which will be equal to 1015 MHz in the example chosen above. This signal OS is multiplied by the input signal IS by the mixers MX1, MX2 so that RF=FLO−FI. The frequency converter according to the invention does not introduce into the radio frequency signal RS, which forms its output signal, any component having the image frequency FLO+FI, which will be equal to 1195 MHz in the example of the GSM standard. For this purpose, the frequency converter comprises:

a first quadratic module QM1 designed for receiving the output signal OS from the oscillator VCO and for supplying a first and a second output signal LO1 and LO2 in mutual phase quadrature, both having the oscillation frequency FLO as their frequency, a second quadratic module QM2 designed for receiving the input signal IS and for supplying a first and a second output signal FI1 and FI2 in mutual phase quadrature, both having the intermediate frequency FI as their frequency, a first mixer MX1 designed for supplying an output signal RS1 which represents a product of the first output signals LO1 and FI1 of the first and the second quadratic modules QM1 and QM2, a second mixer MX2 designed for supplying an output signal RS2 representing a product between the second output signals LO2 and FI2 of the first and second quadratic modules QM1 and QM2, and combination means COMB for recombining the output signals RS1 and RS2 of the first and second mixers MX1 and MX2.

The advantages of the invention may be readily understood in the light of the following example, in which the input signal IS of the frequency converter is given by the expression: IS=sin($\omega_{FI}$·t), while the output signal OS of the oscillator VCO is given by the expression: OS=sin($\omega_{LO}$)·t), with $\omega_{FI}$=2Π·FI, and $\omega_{LO}$=2Π·FLO. In this example, the first and second quadratic modules QM1 and QM2 are arranged so as to generate first and second signals (FI1; FI2) and (LO1; LO2), respectively, written as follows:

$$FI1=sin(\omega_{FI} \cdot t+\Pi)$$

$$FI2=sin(\omega_{FI} \cdot t+3\Pi/2)$$

$$LO1=sin(\omega_{LO} \cdot t+\Pi/4)$$

$$LO2=sin(\omega_{LO} \cdot t+3\Pi/4)$$

The output signals RS1 and RS2 of the first and second mixers MX1 and MX2 resulting from the multiplications operated by said mixers may then be written as follows, using conventional trigonometric formulas:

$$RS1=(sin((\omega_{LO}-\omega_{FI}) \cdot t+\Pi/4))/2-(sin((\omega_{LO}+\omega_{FI}) \cdot t+\Pi/4))/2, \text{ and}$$

$$RS2=(sin((\omega_{LO}+\omega_{FI}) \cdot t+\Pi/4))/2+(sin((\omega_{LO}-\omega_{FI}) \cdot t+\Pi/4))/2.$$

After recombination of said output signals, the frequency converter delivers a signal RS representing the sum of the output signals RS1 and RS2 of the first and second mixers MX1 and MX2, which is thus given by the equation $$RS=sin((\omega_{LO}-\omega_{FI}) \cdot t+\Pi/4)=sin(\omega_{RF} \cdot t+\Pi/4),$$

and which accordingly only contains a component with the radio frequency equal to ωhd RF/2Π. The frequency converter according to the invention thus automatically performs a satisfactory rejection of the image frequency, because no component containing sin(($\omega_{LO}+\omega_{FI}$)·t) appears in the output signal RS of the frequency converter. The separation of the output signal of an oscillator into two components 90° out of phase with one another is current practice in the electronics industry, and numerous embodiments of the first quadratic module QM1 can be found in the prior art literature. The realization of the second quadratic module QM2 and its interaction with the first and the second mixer MX1 and MX2 may be optimized so as to provide the best possible linearity and the highest possible gain, while reducing to a minimum the noise generated by the multiplications carried out by the mixers MX1 and MX2.

Figure 2:
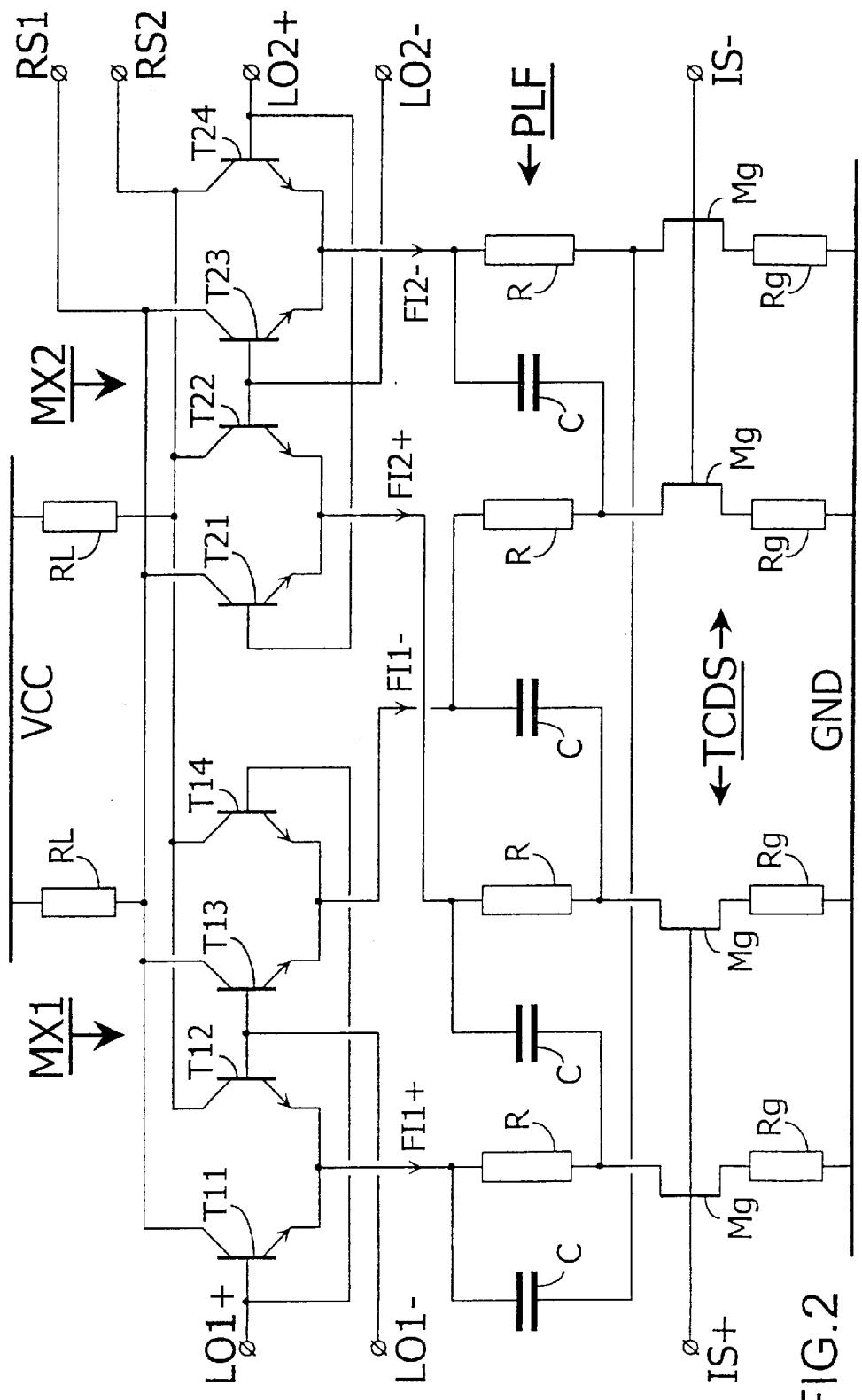
FIG. 2 is a circuit diagram representing a preferred embodiment of part of such a frequency converter.

FIG. 2 is a circuit diagram representing such an embodiment of the second quadratic module and the first and second mixers MX1 and MX2, which are here incorporated into a same integrated circuit. In this embodiment, the input signal IS of the frequency converter is a differential voltage signal (IS+, IS−), and the first and second output signals LO1 and LO2 of the first quadratic module QM1 are also of a differential character (LO1+, LO1−) and (LO2+, LO2−). The second quadratic module comprises a transconductance stage TCDS enabling a transformation of the voltage information formed by the input signal (IS+, IS−) into a current information. This transconductance stage is formed by resistors Rg connected in series with transistors Mg whose conduction is controlled by the input signal (IS+, IS−). The association of a transistor with a resistor forms a current source which is intended to generate a current whose value is proportional to the value of the bias voltage of the transistors and accordingly, in the present case, to the value of the input signal (IS+, IS−). Advantageously, NMOS-type transistors will be chosen for obtaining the best possible linearity in the voltage/current conversion. The second quadratic module in addition comprises a polyphase filter PLF formed by a network RC capable of producing a first and a second differential current (FI1+, FI1−) and (FI2+, FI2−) which are 90° out of phase with one another. These differential currents form the first and second output signals of the second quadratic module and are representative of the input signal (IS+, IS−) whose frequency constitutes the useful information carried by said signal.

The 90° phase shift is obtained through the choice of a value such as:

$$\Pi/2 = 2 \cdot \arctan(2\Pi \cdot R \cdot C \cdot FI), \text{ i.e. } RC = 1/\omega_{FI}$$

for the pole RC of the polyphase filter PLF.

Each mixer MXi (with i=1 or 2) comprises two differential pairs (Ti1, Ti2) and (Ti3, Ti4) forming a Gilbert cell whose conduction is to be controlled by one of the output signals (LOi+, LOi−) of the first quadratic module, and which pairs are intended to be baised by means of one of the output signals (FIi+, FIi−) of the second quadratic module. The collectors of the transistors (Ti1, Ti3) are all joined together and form a first output terminal which is to supply the first output signal RS1. The collectors of the transistors (Ti2, Ti4) are all joined together and form a second output terminal which is to supply the second output signal RS2. Each output terminal is in addition connected to a supply terminal VCC via a load resistance RL. The integrated circuit described in this embodiment is remarkable in that it reduces to a minimum the interfaces between the input signal IS of the frequency converter and the mixers MX1 and MX2, thus reducing the noise generated by the circuit, and in that the elements used thereby, which are in direct interaction with one another, present a high degree of linearity.

The nodal connections between the collectors of the individual differential pairs may be considered as forming part of the combination means referred to above. Indeed, they have the effect of adding together the contributions of the output signals of the two mixers MX1 and MX2 and generate signals RS1 and RS2 which are freed from any parasitic components having the image frequency. It is furthermore possible to select one of the first and second signals RS1 and RS2 so as to constitute the radio frequency signal RF. This, however, would lead to a gain loss of 6 dB. It is preferable to combine the two signals RS1 and RS2 thus generated into a single signal which will enable to reduce this gain loss to a high degree.

Figure 3:
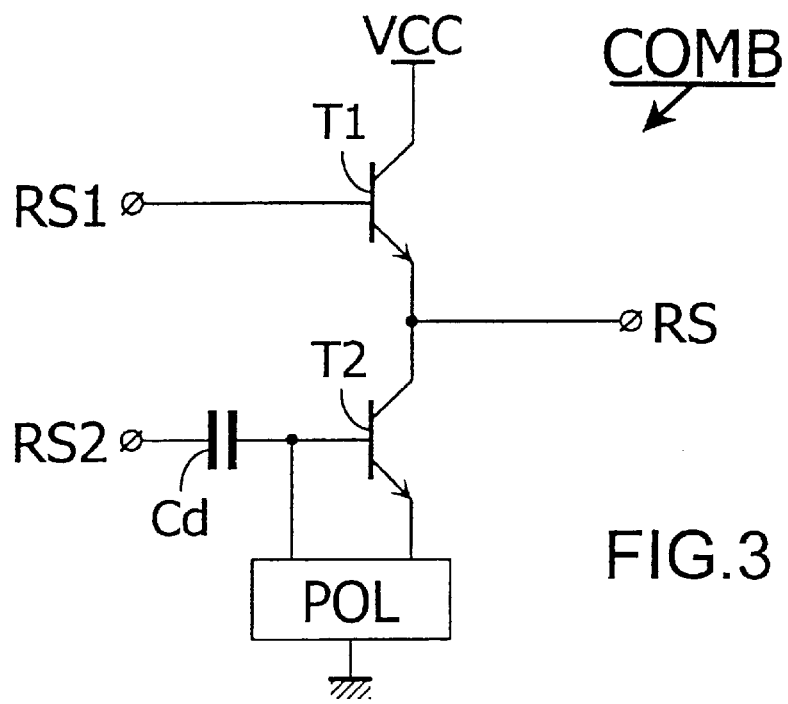
FIG. 3 is a circuit diagram showing combination means used in a particular embodiment of the invention.

FIG. 3 shows an embodiment of the combination means COMB used for this purpose. These means include a first and a second transistor T1 and T2 arranged in series between the supply terminal VCC and ground, the conduction of these transistors being respectively controlled by the first and the second output signal RS1 and RS2, of the mixers, while the output signal RS of the frequency converter being then obtained at an intermediate junction point of said transistors T1 and T2. The second transistor T2 is subjected to a specific biasing for avoiding it becoming saturated. If, for example, the supply voltage VCC is 3 V, the value of the DC component of the signals RS1 and RS2 would ideally be 1.5 V so as to provide to these signals the widest possible range of instantaneous variations. This means that the value of the DC component of the output signal RS is 1.5 V−Vbe(T1), in which Vbe(T1) is the base-emitter voltage of the first transistor T1, which typically lies close to 0.6 V. The variation range of the collector-emitter voltage of the second transistor T2, Vce(T2), thus is not higher than 0.9 V, which requires a special biasing of the second transistor T2. For this purpose, a decoupling capacitance Cd is arranged upstream of the base of said transistor T2, and biasing means POL formed, for example, by base and emitter resistors in accordance with techniques familiar to those skilled in the art, give to the base of the second transistor T2 a potential determined by its operating conditions as described above.

Figure 4:
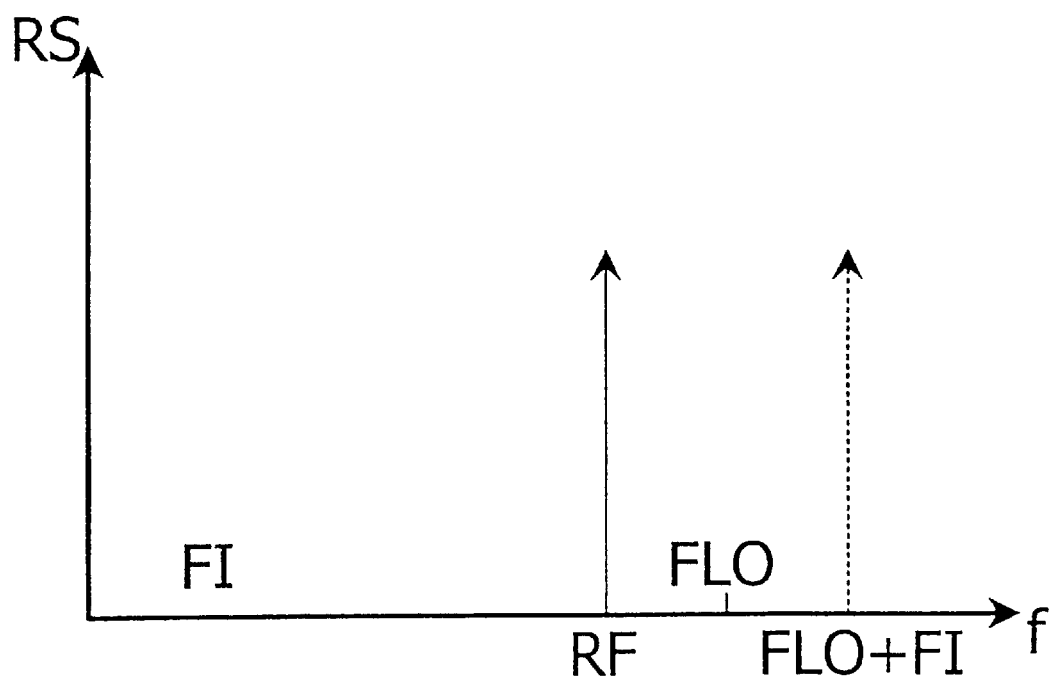
FIG. 4 is a frequency diagram illustrating the advantages of the invention.

FIG. 4 illustrates the rejection of the image frequency performed by the frequency converter according to the invention. The output signal RS of this converter, which results from the multiplication of a signal having an intermediate frequency FI by a signal having an oscillation frequency FLO, exhibits a single main component at a radio frequency RF equal to FLO−FI. The component having the image frequency FLO+FI, shown in a dotted line in the Figure and present in the output signal of the known converter, is thanks to the invention suppressed within the frequency converter itself.

What is claimed is:

1. A frequency converter for receiving an input signal having an intermediate frequency and a signal originating from an oscillator and having an oscillation frequency, which frequency converter comprises:

a first quadratic module for receiving an output signal from the oscillator and for supplying a first and a second output signal in mutual phase quadrature, both the first and the second output signal having the oscillation frequency as their frequency, a second quadratic module designed for receiving the input signal of the converter and for supplying a first and a second output signal in mutual phase quadrature, both the first and the second output signal having the intermediate frequency as their frequency, a first mixer for supplying an output signal representing a product of the first output signals of the first and second quadratic modules, a second mixer for supplying an output signal representing a product between the second output signals of the first and second quadratic modules, and combination means for recombining the output signals of the first and second mixers, wherein an output signal supplied by the frequency converter has a radio frequency whose value is equal to the absolute value of the difference between the oscillation frequency and the intermediate frequency.

2. The frequency converter of claim 1, wherein each mixer comprises two differential pairs forming a Gilbert cell whose conduction may be controlled by one of the output signals of the first quadratic module, and which pairs are designed to be biased by means of one of the output signals of the second quadratic module.

3. The frequency converter of claim 1, wherein the second quadratic module is provided with a transconductance stage enabling it to transform a voltage information carried by the input signal of the converter into a current information.

4. The frequency converter of claim 1, wherein the second quadratic module includes a polyphase filter enabling the production of a plurality of currents out of phase with one another and representative of the information carried by the input signal.

5. The frequency converter of claim 1, wherein the second quadratic module and the first and the second mixer are incorporated in a same integrated circuit.

6. A wireless telephony device with a signal processing unit and an antenna designed for transmitting a radio frequency signal, said wireless telephony comprising:

a frequency converter for receiving an input signal having an intermediate frequency and a signal originating from an oscillator and having an oscillation frequency, and for supplying an output signal having a radio frequency whose value is equal to the absolute value of the difference between the oscillation frequency and the intermediate frequency, said frequency converter has a first quadratic module for receiving an output signal from the oscillator and for supplying a first and a second output signal in mutual phase quadrature, both the first and the second output signal having the oscillation frequency as their frequency; a second quadratic module for receiving the input signal of the converter and for supplying a first and a second output signal in mutual phase quadrature, both the first and the second output signal having the intermediate frequency as their frequency; a first mixer for supplying an output signal representing a product of the first output signals of the first and second quadratic modules; a second mixer for supplying an output signal representing a product between the second output signals of the first and second quadratic modules; and combination means for recombining the output signals of the first and second mixers, wherein said wireless telephony device receives its input signal from the signal processing unit, while the output signal of said frequency converter forms the radio frequency signal.

\* \* \* \* \*